United States Patent [19]
Basell et al.

[11] Patent Number: 5,717,336
[45] Date of Patent: Feb. 10, 1998

[54] METHOD AND APPARATUS FOR DETERMINING THE CHARGE CONDITION OF AN ELECTROCHEMICAL CELL

[75] Inventors: Malcolm Charles Basell, The Patch; John Maurice Hawkins, Rowville, both of Australia

[73] Assignee: Elcorp Pty. Ltd., Victoria, Australia

[21] Appl. No.: 464,814

[22] PCT Filed: Dec. 24, 1993

[86] PCT No.: PCT/AU93/00678

§ 371 Date: Aug. 25, 1995

§ 102(e) Date: Aug. 25, 1995

[87] PCT Pub. No.: WO94/15222

PCT Pub. Date: Jul. 7, 1994

[30] Foreign Application Priority Data

Dec. 24, 1992 [AU] Australia ............... 6566/92

[51] Int. Cl.⁶ .................................................. G01R 31/36
[52] U.S. Cl. .......................... 324/430; 324/650; 324/436; 340/636; 320/48
[58] Field of Search ......................... 320/48; 340/636; 324/430, 429, 433, 650, 436

[56] References Cited

U.S. PATENT DOCUMENTS

| | | |
|---|---|---|
| 3,873,911 | 3/1975 | Champlin . |
| 3,971,365 | 7/1976 | Smith . |
| 4,409,543 | 10/1983 | Sugihara . |
| 4,498,044 | 2/1985 | Horn . |
| 4,678,998 | 7/1987 | Muramatsu ............... 324/430 |
| 4,697,134 | 9/1987 | Burkum . |
| 4,743,855 | 5/1988 | Randin ............... 324/430 |
| 4,888,701 | 12/1989 | Wakasugi et al. . |
| 4,935,692 | 6/1990 | Wakasugi . |
| 4,947,130 | 8/1990 | Kitayoshi ............... 324/650 |
| 5,241,275 | 8/1993 | Fang ............... 324/433 |

FOREIGN PATENT DOCUMENTS

| | | |
|---|---|---|
| 0095839 | 12/1983 | European Pat. Off. . |
| 0321963 | 6/1989 | European Pat. Off. . |
| 1514182 | 6/1978 | United Kingdom . |
| 2088159 | 11/1980 | United Kingdom . |
| 5322666 | 11/1993 | WIPO ............... 324/430 |

OTHER PUBLICATIONS

As Sibe Hard Body "HF Meter of Impedance of Electro-Chemical Systems," SU 1432417 (23 Oct. 1988).
Gitelson V.D. "Complex Resistances Individual Parameters Meter," SU 1366969 (15 Jan. 1988).
Krasy Poly "Geophysical Research Rock and Ore Electric Properties Measurer," SU 1239632 (23 Jun. 1986).
Lvov Poly "Impedance Components Measuring Appts." SU 808971 (28 Feb. 1981).

*Primary Examiner*—Ernest F. Karlsen
*Assistant Examiner*—Jose M. Solis
*Attorney, Agent, or Firm*—Walter H. Dreger

[57] ABSTRACT

A method for determining whether an electrochemical cell is substantially fully charged. The determination is made by ascertaining the rate of change of the impedance of the cell with changing frequency, at low frequency. A method for determining the state of charge of an electrochemical cell by comparing the impedance of the cell at two or more frequencies or by comparing the impedance of the cell, at a medium frequency, with the impedance at high frequency. Apparatus for generating output signals representative of the magnitude of resistive and reactive components of an impedance (30). The apparatus has a signal generator (70) for passing AC current through the impedance, and a synchronous demodulator circuit (88) for demodulating AC signal appearing across the impedance pursuant to passing the current through it. A phase shift circuit (130, 132, 136, 138, 140) selectively generates control signals in phase or 90° phase shifted relative to the AC current through the impedance to control the demodulator circuit to respectively produce the output signals representing resistive and reactive components.

22 Claims, 3 Drawing Sheets

METHOD AND APPARATUS FOR DETERMINING THE CHARGE CONDITION OF AN ELECTROCHEMICAL CELL

This invention relates to a method and apparatus for determining the charge condition of an electrochemical cell. It is often of importance to know the charge condition of an electrochemical cell. For rechargeable or secondary cells, the general performance is affected by the history of charge and discharge cycles. Particularly, the lifetime of a lead acid cell is so affected to a very substantial degree. In order to manage charge and discharge cycles in a fashion which ensures better performance, it is however necessary to ascertain when charging is required, which involves acquiring knowledge of the prevailing state of charge of the cell.

Measurements of cell resistance or impedance may be made in order to assess state of charge; see for example U.S. Pat. Nos. 4,697,134, 3,873,911, 3,676,990 and United Kingdom Patent Specification 2088159. Generally, these measurements concentrate on DC resistance or impedance at the mid frequency region, where the difference in absolute values of impedance for fully charged and partially charged batteries is very small. This has meant that, to determine with any degree of certainty the state of charge of a battery, the impedance of that particular battery needs to be measured in advance at various states of charge and compared with the presently prevailing measurement. Because of impedance variations from battery to battery, every battery needs to be so characterised initially. Also, as the battery approaches the fully charged state, the change in impedance becomes small so that it is very difficult to measure state of charge above 75% charged.

SUMMARY OF THE INVENTION

In one aspect, the invention provides a method for determining whether an electrochemical cell is substantially fully charged, wherein the determination is made by ascertaining the rate of change of the impedance of the cell with changing frequency, at low frequency.

The invention also provides a method for determining the state of charge of an electrochemical cell, comprising comparing the impedance of the cell at two or more frequencies.

The invention also provides a method for determining the state of charge of an electrochemical cell, comprising comparing the impedance of the cell at a medium frequency, with the impedance at high frequency.

The high frequency may be about 100 kHz or in the range 30 kHz to 500 kHz.

The low frequency may be about 0.03 Hz or in the range 0.003 to 1 Hz.

The medium frequency may be about 300 Hz or in the range 10 to 1000 Hz.

In another aspect, the invention provides a method for determining whether an electrochemical cell is substantially fully charged, wherein the determination is made by ascertaining the rate of change of the impedance of the cell with changing frequency, at frequencies at which the cell exhibits a greater impedance when charged than when not charged.

The invention still further provides a method for determining the state of charge of an electrochemical cell, comprising comparing the impedance of the cell at a frequency at which the cell exhibits decreased impedance when charged, with the impedance at a higher frequency at which the impedance is substantially independent of the state of charge.

The invention also provides apparatus for carrying out the methods comprising means for applying to an electrochemical cell an AC signal of differing frequencies and means for measuring the impedance of the cell at those frequencies.

Separate signals for separate differing frequencies may be applied sequentially or signals have differing frequency components may be applied, or both techniques may be applied together.

In another aspect, the invention provides apparatus for generating signals representative of resistive and reactive components of an impedance, comprising AC generator means for generating an AC current for passing through the impedance, and a synchronous demodulating means couplable across the impedance for demodulating AC signal generated across the impedance pursuant to passing of said current through the impedance, said demodulating means being coupled to said generator means so as in use to be controlled in accordance with the frequency of said current, the apparatus being selectively conditionable to a first condition at which the magnitude of a DC signal generated at the output of the demodulating means is related to the magnitude of the resistive component of the impedance and to a second condition at which the magnitude of the DC signal is related to the magnitude of the reactive component thereof. More particularly, a phase shift circuit may be provided for generating an alternating control signal, the control signal being in phase with said current in said first condition and phase shifted by 90° relative to said current in said second condition, switching means being provided, being selectively operable and coupled to said synchronous demodulating means to apply the control signal to the demodulating means for controlling operation of the demodulating means in accordance with occurrences of zero crossings of said current, to place the apparatus in said first condition, whereby said DC signal is representative of said resistive component, or in accordance with occurrence of phase shifts of 90° relative to the zero crossings, to place the apparatus in said second condition, whereby said DC signal is representative of said reactive component.

The invention also provides a method for generating signals representative of resistive and reactive components of an impedance, comprising passing an AC current through the impedance, demodulating AC signal generated across the impedance pursuant to passing of said current through the impedance, by use of a synchronous demodulating means coupled across the impedance, the demodulating means being coupled to the generator so as to be controlled by an alternating control signal derived from the output of the generator, and of the same frequency as said current, and causing the relative phase shift between the control signal and said current to adopt a first relationship at which the magnitude of a DC signal generated at the output of the demodulating means is related to the magnitude of one of the resistive and reactive components of the impedance and then to adopt a second relationship at which the magnitude of the DC signal is related to the magnitude of the other of the resistive and reactive components of the impedance.

BRIEF DESCRIPTION OF THE DRAWINGS:

The invention is further described by way of example only with reference to the accompanying drawing in which.

Figure 1:
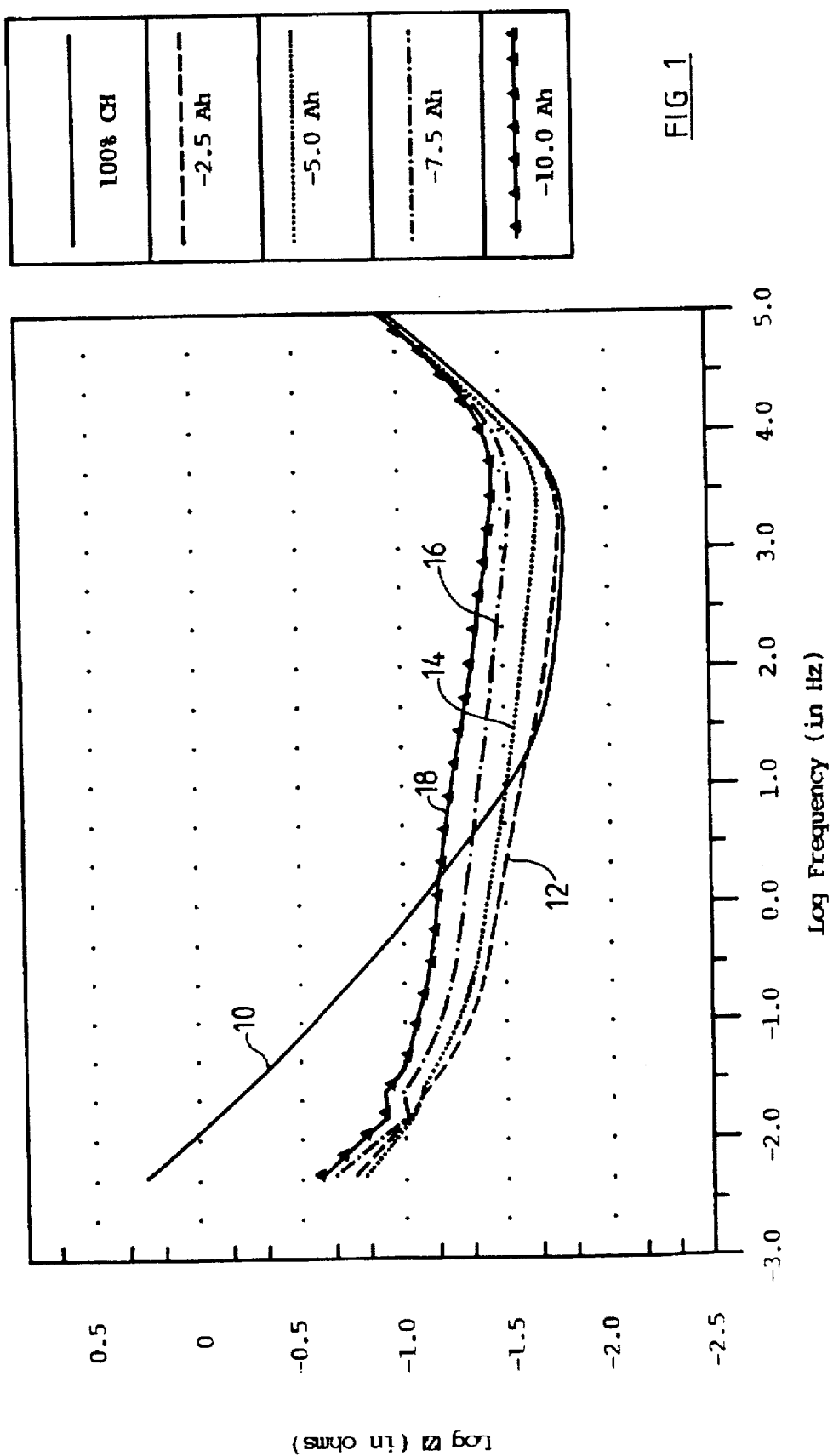
FIG. 1 is a graph illustrating the manner of change of impedance of a lead acid battery with change in frequency, for various change states of a battery.

Referring firstly to FIG. 1, five plots 10, 12, 14, 16, 18 of impedance against frequency for a lead acid battery are shown. The results were obtained using a method of the present invention described later, for a 6V 10 Ah battery marketed under the brand name "Century", of the valve regulated type, but are typical in form for lead acid cells.

The impedance magnitude of the battery is shown plotted against frequency on a log-log scale. At mid-frequencies, the impedance is fairly constant, as shown in FIG. 1 around 100 to 1000 Hz. At higher frequencies, the impedance increases due to the inductance of the battery plates and connecting leads. This is exhibited in the plots of FIG. 1, for frequencies above 10 kHz. At low frequencies, the impedance rises gradually, with the rate of increase of impedance becoming greater as the frequency decreases. This is shown in FIG. 1 for frequencies below 1 Hz.

As the state of charge varies, the impedance also varies. This is shown in FIG. 1 by the plots 10, 12, 14, 16, 18, which were obtained for the following respective states of charge of the battery;

plot 10: 100% charged, plot 12: 75% charged, plot 14: 50% charged, plot 16: 25% charged, and plot 18: fully discharged.

At mid frequencies, the impedance increases as the battery is discharged. At high frequencies, the battery impedance tends to remain constant as the state of charge varies. At low frequencies, there is a clearly discernible difference between a fully charged battery and other battery charge states. For a fully charged battery, the impedance rises much more steeply from about 10 Hz, while the impedance rises more gently at lower states of charge. More particularly, whereas at less than full charge the impedance at low frequencies generally falls with increasing charge, the impedance at full charge at low frequencies exhibits a sudden rise at full charge as compared with that prevailing at substantially all less than full charge states. As the battery is slightly discharged, the steep slope of the impedance plot starts to disappear and at approximately 95% of fully charged the slope has changed to be similar to the other partially charged states. Existence of this steep slope is therefore indicative that the battery is above 95% fully charged.

It has been ascertained that, with the Century 6V 10 Ah battery for which the plots 10, 12, 14, 16, 18 were obtained, a measurement of impedance at say, two or three frequencies centred around 1 Hz is sufficient to determine whether or not the battery is fully charged. The slope of the impedance-frequency plot is very different at around 1 Hz when the battery is fully charged (>95% charged). In general the slope of the impedance-frequency plot is less than −0.6 for the fully charged battery and greater than −0.2 for the partially charged battery states.

It has been found that with different lead-acid battery types and sizes, the slope varies, however there remains a distinct difference between fully charged and partially charged batteries. To determine the relationship between impedance and frequency for different charge states, for a particular type of battery, the battery may be fully charged and then partially discharged to determine the different relationships, particularly the slope of plots of the form of FIG. 1.

In the light of the above, to determine whether or not a battery is fully charged, it is necessary only to measure the low frequency impedance. The advantage of measuring the low frequency impedance is that the slope of the impedance is very different between a fully charged battery and a partially charged battery.

Because the impedance variation as between charged and fully charged batteries is so large, it is not necessary to individually measure every battery and determine its impedance characteristic. Type testing is advisable however. For example, having measured one or two Century 6V 10 Ah batteries it was found possible to tell by measuring the impedance slope around 1 Hz whether or not any other Century 6V 10 Ah batteries were fully charged. The slope can be determined by measuring the impedance at two or three frequencies around 1 Hz, e.g. 0.5, 1.0 and 2 Hz.

Other battery types have different impedances and low frequency slopes but the slope difference in the low frequency region is so distinct that the aforementioned type testing is sufficient to provide comparative information useful for substantially all batteries of that type.

If the low frequency impedance characteristic is not known for a particular battery, then the fully charged/not fully charged state can be determined by measuring the impedance when fully charged and when the battery is slightly discharged to less than 95% charged. No other state of charge need be measured.

The method next described permits measurement of state of charge without the need to measure every battery and reduces the measurements to type testing only. e.g. measurement of several Century 6V 10 Ah batteries allows state of charge determination of all Century 6V 10 Ah batteries.

In this method the high frequency impedance is used as a reference, the impedance at these frequencies having being found to be almost constant as the state of charge varies. By using the ratio of high frequency impedance to mid frequency impedance the state of charge can be determined without measuring the battery at known states of charge.

One method of measuring the battery (or cell) impedance is as follows:

A signal generator is connected to the battery and injects a known current into the battery being tested. The current may be either at a single frequency or a number of frequencies added together. In the case of a single frequency measurement a number of measurements are taken sequentially with different frequencies in order to cover the frequency spectrum under consideration. In the case of several frequencies being used simultaneously, a Fourier Transform is used to obtain the frequency spectrum.

Figure 2:
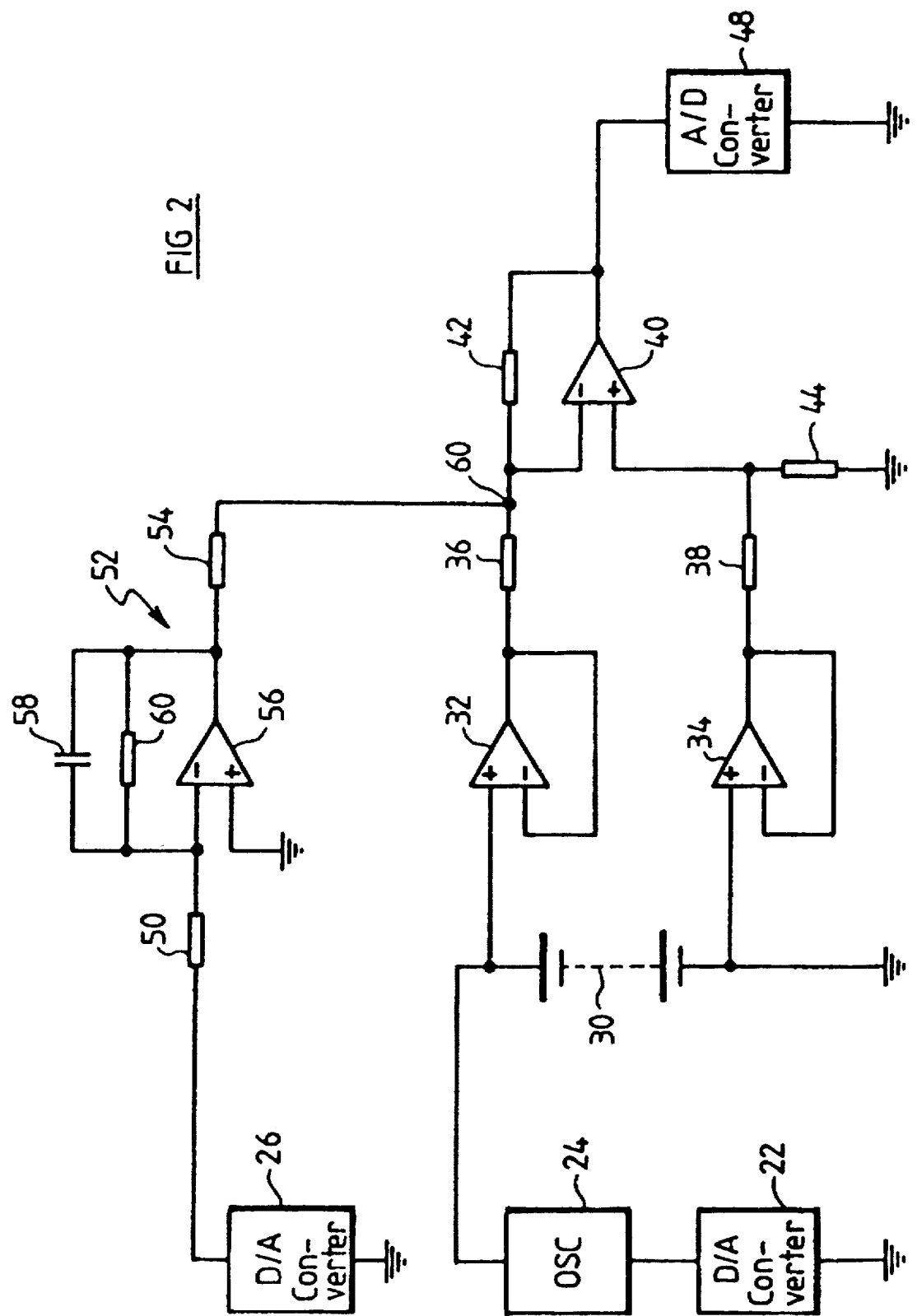
FIG. 2 is a circuit diagram of a first apparatus constructed in accordance with the invention, for determining impedance.

Referring to FIG. 2, the battery 30 is shown having connected thereacross, in series, an oscillator 24 and a digital/analog converter 22. The output from the positive and negative terminals of the battery 30 is applied via high impedance input amplifiers 32, 34 respectively through series resistors 36, 38 respectively to inputs of an operational amplifier 40 having a feedback resistor 42 connected from the output to the inverting input thereof. The non-inverting input is connected to the negative battery terminal via a resistor 44. Output from the amplifier 40 is connected to an analog/digital converter 48.

The circuit also includes a second digital/analog converter 26 connected to the inverting input of the amplifier 40 via the series combination of a resistor 50, amplifier stage 52, and resistor 54. Amplifier stage 52 includes an operational amplifier 56 having its non-inverting input connected to the negative side of the battery and its inverting input connected to the resistor 50. A parallel connected capacitor 58 and resistor 60 are connected from the output of the amplifier 56 to the inverting input thereof.

The circuit shown in FIG. 2 is used to determine the impedance of battery 30 at various frequencies established by changing the frequency of operation of oscillator 24, the following sequence being followed for each selected frequency:

1. Without the oscillator 24 operating, a digital input is applied to the digital/analog converter 26 to cause it to generate an analog voltage at the point 60 in the circuit, namely at the inverting input to the amplifier 40 and at the output from the battery as applied via the amplifier 32 and resistor 36 to that inverting input, such that signal to analog/digital converter 48, as so applied via the amplifier 40, is zero. That is to say, the voltage from the digital/analog converter as coupled to point 60 is subtracted from the battery output voltage as applied to that point, the so subtracted voltage being equal to the battery voltage as applied at point 60.

2. The digital/analog converter 22 is then conditioned by application of a digital input thereof corresponding to the digital output of analog/digital converter 48, so as to generate at the output of the digital/analog converter 22 a voltage equal to the battery voltage.

3. The oscillator 24 is then operated to generate current signals which are applied to the battery, being signals of the required frequency at which it is desired to measure the impedance of the battery.

4. The AC voltage then existing across the battery is measured and is represented by the digital output of the analog/digital converter 48.

By the above method, the oscillator 24 is not required to produce an off-setting DC current and is only required to produce an AC current.

A series of voltage measurements as provided by analog/digital converter 48 are then taken to permit the application of the described methods for determining whether the battery is fully charged or to determine the state of charge of the battery.

Figure 3:
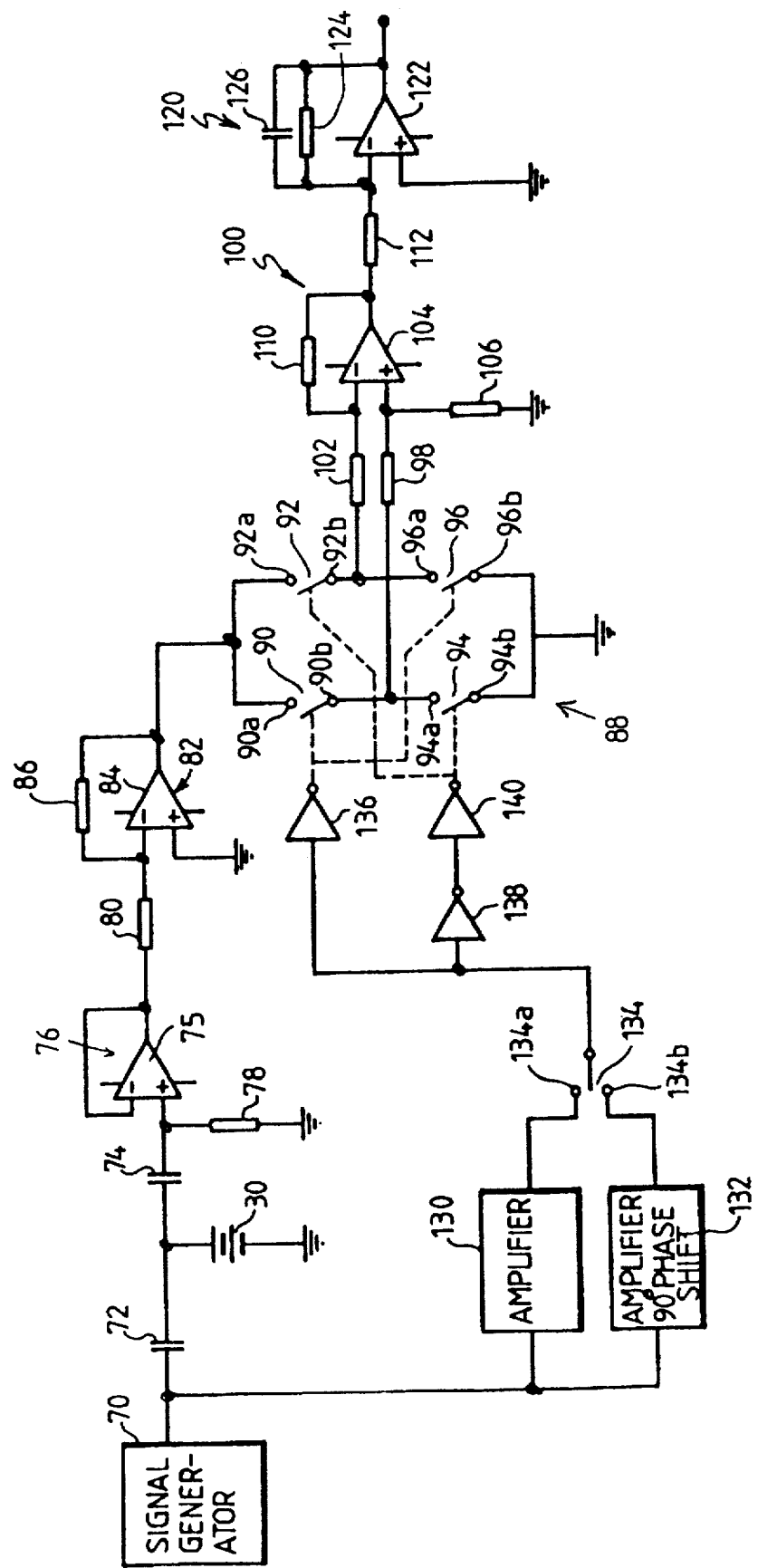
FIG. 3 is a circuit diagram of a second apparatus constructed in accordance with the invention, for determining impedance.

Referring now to FIG. 3, the battery 30 has a sinusoidal current signal applied thereto from a signal generator 70, via a decoupling capacitor 72. This current signal is in this case applied to the positive terminal of the battery. The positive terminal of the battery is connected via a further decoupling capacitor 74 to a high input impedance amplifier stage 76, having an operational amplifier 75 to which the output of the capacitor 74 is connected, at the non-inverting input terminal. The inverting input terminal of operational amplifier 75 is connected to the output thereof. The non-inverting terminal is also connected to ground via resistor 78. Output from amplifier stage 76 is applied via resistor 80 to a further amplification stage 82, this having an operational amplifier 84 which receives output from the resistor 80 at the inverting terminal thereof, which inverting terminal is connected to the output via a resistor 86. The non-inverting terminal of amplifier 84 is connected to the negative terminal of the battery.

Output from amplifier stage 82 is connected to a synchronous demodulation circuit 88. In particular, that output is connected to respective terminals 90a, 92a of two switches 90, 92 of that demodulator circuit. In addition to the switches 90 and 92, the demodulator circuit includes two further switches 94 and 96. Second switch terminals 90b, 92b of switches 90, 92 are connected to terminals 94a, 96a of switches 94, 96. The other terminals 94b, 96b of the two switches 94, 96 are connected together and to the negative terminal of the battery. The commonly connected terminals 90b, 94a of switches 90, 94 are connected via a resistor 98 to a differential amplifier 100, and the commonly connected terminals 92b, 96a of switches 92, 96 are likewise connected to the differential amplifier 100 via a resistor 102.

Differential amplifier 100 comprises an operational amplifier 104 having its inverting terminal connected to the output of resistor 102 and its non-inverting input connected to the output of resistor 98, which non-inverting input is connected to the negative supply of the battery via an input resistor 106. The inverting input of the operational amplifier 104 is connected to the output of the operational amplifier via a further resistor 110.

Output from operational amplifier 104, and thus from the differential amplifier 100, is applied via a resistor 112 to a low pass filter 120. Low pass filter 120 comprises an operational amplifier 122 having its inverting input terminal connected to the output of resistor 112 and also, via a parallel connected resistor 124 and capacitor 126, to the output of the operational amplifier 122. The non-inverting input of the operational amplifier 122 is connected to the negative battery terminal.

In addition to the above described components, the circuit of FIG. 3 further includes an amplifier 130 which is connected to receive the output of the signal generator 70 and a further amplifier 132 which also is connected to receive the output of the signal generator 70. Amplifier 132 however incorporates circuitry which shifts the phase of the output thereof relative to the output of the amplifier 130 by 90°.

The outputs of the two amplifiers 130, 132 are connected to terminals 134a, 134b of a switch 134. A further terminal 134c of switch 134 is connected to a moveable switch arm which permits coupling selectively of terminal 134a or terminal 134b to terminal 134c.

Terminal 134c is connected to an inverter 136 and also to two series connected inverters 138, 140. The outputs from inverters 136, 140 are thus opposite. That is to say, when the output of inverter of 136 is high, that of inverter 140 is low, and vice versa.

The switches 90, 92, 94, 96 are electronic switches and are coupled to the outputs of the inverters 136, 140 in such a fashion as to control the opening and closing of these switches in accordance with the output states of the inverters. In particular, the switches 94 and 92 are controlled by the output of inverter 140 so as to be both closed at once and both open at once. The switches 90 and 96 are controlled in accordance with the output of inverter 136 so as to be both open together and closed together. Furthermore, because of the relative reversals of the outputs of the two inverters 136, 140 (because of the interposition of the additional inverter 138 in the input to inverter 140) the switches 94, 92 are controlled so as to be closed when the switches 90 and 96 are open and open when the switches 90 and 96 are closed.

In operation, the required sine wave current signal is generated at the signal generator 70, and is selectively switched to the differential amplifier 100 by operation of the synchronous demodulation circuit 88. The amplifiers 130, 132 operate to provide outputs, from the sinusoidal input applied thereto, which are of square wave form. In the case of amplifier 130 the output has zero crossing of the output corresponding to zero crossings of the input and, in the case of the amplifier 132, the output zero crossings are displaced by 90° from the zero crossings of the input.

The effect of the demodulation circuit 88 is to apply to the differential amplifier stage 100 a voltage which is unidirectional and which corresponds to the magnitude of the AC current passed through the battery 30 pursuant to operation of the signal generator 70. The output from the differential amplifier stage 100 is smoothed by the low pass filter 120 to appear at the output thereof as a DC voltage which is proportional to the AC voltage across the battery and also proportional, therefore, to the battery impedance. By measuring this voltage for the condition when the signal generator output is applied through amplifier 130 to control the synchronous demodulation circuit 88, a voltage output is produced which is proportional to the resistive component of the impedance, whilst when the output of the signal generator is applied to control the demodulation circuit 88 via the 90° phase shifted output of amplifier 132, a voltage output is obtained which is representative of the reactive component of the impedance, so that the total impedance can be determined by vector addition of the output voltages under these two conditions, and division by the current applied to the battery, which current may be measured by any suitable means, such as an AC current meter. If the current is controlled to a known value, the voltage outputs from the apparatus for the resistive and reactive components enable direct determination of impedance. In either event the necessary vector addition may be accomplished by a suitable computer which receives the outputs. The switching of outputs of amplifiers 130, 132 to so direct these outputs selectively to the demodulation circuit 88 is effected by operating switch 134.

The arrangement of FIG. 3 has the advantage that the synchronous demodulation circuit 88 provides discrimination over spurious signals not of the frequency of the signal generated by the generator 70, so that more accurate results can be obtained.

While in the described arrangements signals of differing frequencies are applied to enable sequential determination of the cell impedance at each frequency, a signal having components of differing frequency may be employed to permit simultaneous determination of impedances at the frequencies of the components. Switchable bandpass filters may be employed to separate current or voltage signals of the differing components, for individual determination. Also, although discrete frequency signals are employed in the described arrangement, a swept frequency signal may be employed.

The invention has been described with reference to the lead-acid batteries but is applicable to other electrochemical batteries or cells, particularly but not exclusively secondary batteries or cells. The described apparatus and methods for measuring impedance may be applied to measuring impedance of other than batteries or cells.

The described methods and apparatus have been advanced by way of explanation only and many variations and modifications may be made thereto within the scope of the appended claims.

We claim:

1. A method for determining whether an electrochemical cell is substantially fully charged, comprising the steps of:
   a) measuring the impedance of the cell at a first low frequency;
   b) measuring the impedance of the cell at a second low frequency;
   c) determining a rate of change of impedance between said first low frequency and said second low frequency; and
   d) concluding said cell is substantially fully charged when said rate of change of impedance is greater than a pre-determined amount.

2. A method as claimed in claim 1 wherein said low frequency is about 0.03 Hz.

3. A method as claimed in claim 1 wherein said low frequency is in the range 0.003 to 1 Hz.

4. A method for determining whether an electrochemical cell is substantially fully charged, comprising:
   the step of:
   a) measuring the impedance of the cell at a first low frequency, wherein the impedance of said cell is higher at said first low frequency when said cell is substantially fully charged than when said cell is not substantially fully charged;
   b) measuring the impedance of the cell at a second low frequency, wherein the impedance of said cell is higher at said second low frequency when said cell is substantially fully charged than when said cell is not substantially fully charged;
   c) determining a rate of change of impedance between said first low frequency and said second low frequency; and
   d) concluding said cell is substantially fully charged when said rate of change of impedance is greater than a predetermined amount.

5. A method as claimed in claim 1, comprising comparing the impedance of the cell at two or more low frequencies.

6. A method as claimed in claim 5 wherein said frequencies are about 0.03 Hz.

7. A method as claimed in claim 5 wherein said frequencies are in the range 0.003 to 1 Hz.

8. A method as claimed in claim 4 wherein said frequencies are about 0.03 Hz.

9. A method as claimed in claim 4 wherein said frequencies are in the range 0.003 to 1 Hz.

10. A method as claimed in claim 1 wherein said cell is a lead-acid cell.

11. A method as claimed in claim 2 wherein said cell is a lead-acid cell.

12. A method as claimed in claim 3 wherein said cell is a lead-acid cell.

13. A method as claimed in claim 5 wherein said cell is a lead-acid cell.

14. A method as claimed in claim 6 wherein said cell is a lead-acid cell.

15. A method as claimed in claim 7 wherein said cell is a lead-acid cell.

16. A method as claimed in claim 4 wherein said cell is a lead-acid cell.

17. A method as claimed in claim 8 wherein said cell is a lead-acid cell.

18. A method as claimed in claim 9 wherein said cell is a lead-acid cell.

19. The method for determining whether an electrochemical cell is substantially fully charged as set forth in claim 1, wherein:
   said determining step is made by determining the slope on a logarithmic impedance versus logarithmic frequency plot between said first frequency and said second frequency.

20. The method for determining whether an electrochemical cell is substantially fully charged as set forth in claim 19, wherein:
   said concluding step is accomplished when said slope exceeds a pre-determined value.

21. The method for determining whether an electrochemical cell is substantially fully charged as set forth in claim 4, wherein:
   said determining step is made by determining the slope on a logarithmic impedance versus logarithmic frequency plot between said first frequency and said second frequency.

22. The method for determining whether an electrochemical cell is substantially fully charged as set forth in claim 21, wherein:
   said concluding step is accomplished when said slope exceeds a pre-determined value.

* * * * *